(12) United States Patent
Sherman et al.

(10) Patent No.: US 9,376,573 B2
(45) Date of Patent: *Jun. 28, 2016

(54) COATINGS, COMPOSITION AND METHOD RELATED TO NON-SPALLING LOW DENSITY HARDFACE COATINGS

(71) Applicant: Mesocoat, Inc., Euclid, OH (US)

(72) Inventors: Andrew Sherman, Kirkland Hills, OH (US); Curt Glasgow, Euclid, OH (US)

(73) Assignee: MesoCoat Inc., Euclid, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/799,648

(22) Filed: Mar. 13, 2013

(65) Prior Publication Data

US 2014/0134452 A1 May 15, 2014

Related U.S. Application Data

(63) Continuation-in-part of application No. 12/699,779, filed on Feb. 3, 2010, now Pat. No. 8,460,796.

(60) Provisional application No. 61/149,680, filed on Feb. 3, 2009.

(51) Int. Cl.

| | |
|---|---|
| *C09D 1/00* | (2006.01) |
| *C23C 14/22* | (2006.01) |
| *B22F 7/08* | (2006.01) |
| *C22C 29/00* | (2006.01) |
| *C22C 29/02* | (2006.01) |

(52) U.S. Cl.
CPC ... *C09D 1/00* (2013.01); *B22F 7/08* (2013.01); *C22C 29/00* (2013.01); *C23C 4/067* (2016.01); *C23C 14/223* (2013.01); *C22C 29/02* (2013.01); *Y10T 428/12486* (2015.01)

(58) Field of Classification Search
None
See application file for complete search history.

(56) References Cited

U.S. PATENT DOCUMENTS

| | | | | |
|---|---|---|---|---|
| 5,876,793 | A | * | 3/1999 | Sherman et al. ............... 427/213 |
| 7,029,507 | B2 | * | 4/2006 | Yadav et al. ..................... 51/307 |
| 7,635,515 | B1 | * | 12/2009 | Sherman ......................... 428/325 |
| 7,681,622 | B2 | * | 3/2010 | Sherman ........................... 164/46 |
| 8,460,796 | B2 | * | 6/2013 | Sherman ......................... 428/472 |
| 2007/0141270 | A1 | * | 6/2007 | Sherman ......................... 427/446 |

* cited by examiner

Primary Examiner — Vera Katz
(74) Attorney, Agent, or Firm — Lance M. Pritikin

(57) ABSTRACT

A heterogeneous composite body that is spall resistant and comprises a substantially discontinuous cermet phase in a substantially continuous metal rich matrix phase. The heterogeneous composite body is typically bonded to a substrate to form a hardfacing on the substrate. The heterogeneous composite body exhibits ductile phase toughening with a strain to failure of at least about 2 percent, a modulus of elasticity of less than about 35 million pounds per square inch, and a density of less than about 7 grams per cubic centimeter. The metal rich matrix phase between the ceramic rich regions in the heterogeneous composite body has an average minimum span of about 0.5 to 8 microns to allow ductility in the heterogeneous composite body. The heterogeneous composite body has a Vicker's hardness number of greater than approximately 500. The ceramic rich regions exhibit high hardness as compared with the matrix phase.

18 Claims, 3 Drawing Sheets

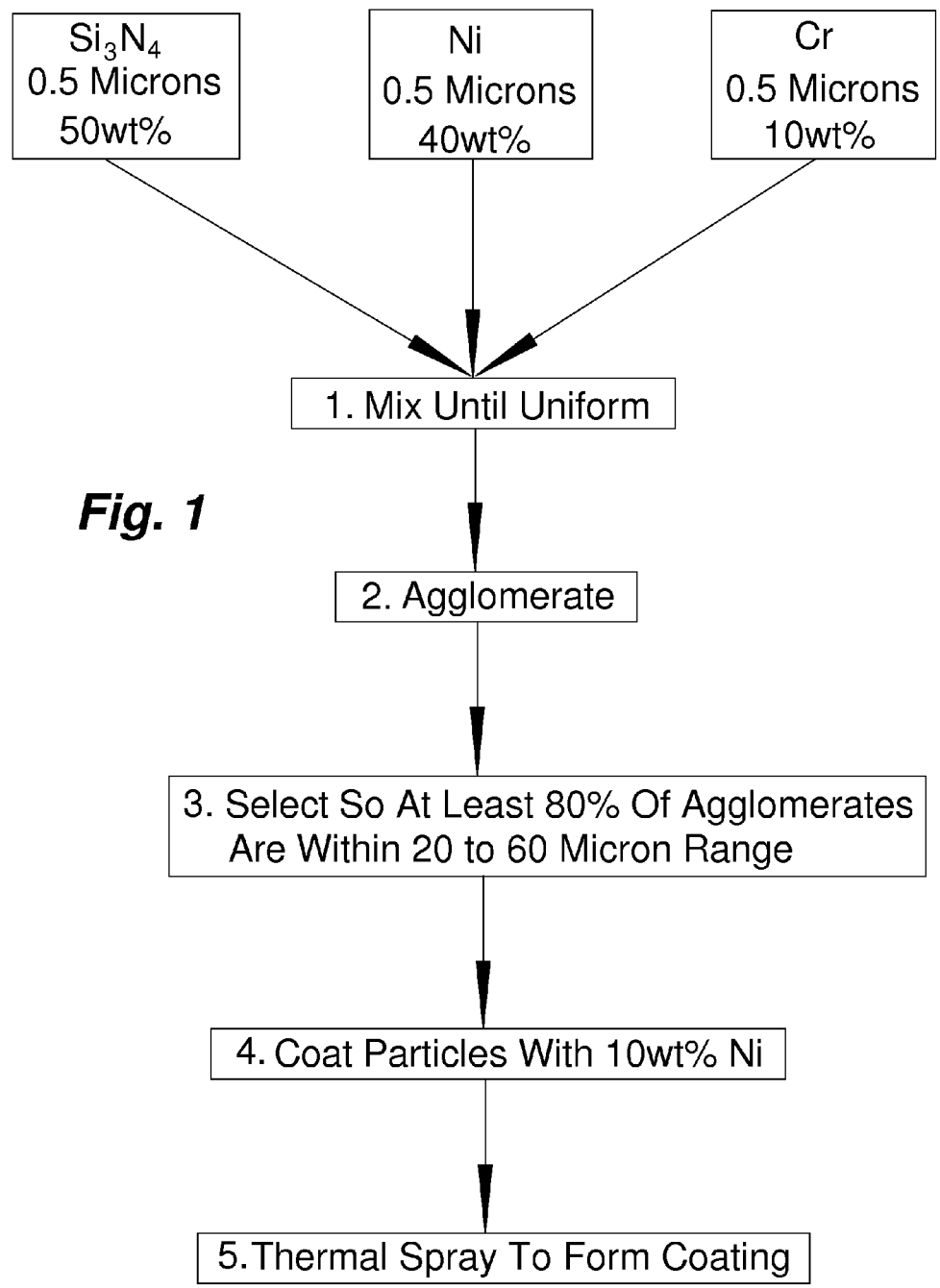

COATINGS, COMPOSITION AND METHOD RELATED TO NON-SPALLING LOW DENSITY HARDFACE COATINGS

RELATED APPLICATIONS

This application is a continuation-in-part of U.S. patent application Ser. No. 12/699,779, filed Feb. 3, 2010, which claims the benefit of U.S. Provisional Application No. 61/149,680, filed Feb. 3, 2009.

GOVERNMENT INTEREST

This invention was made with government support under contract #EPA EP-D-06-053, microcomposite coatings for chrome replacement, awarded by Environmental Protection Agency at 1025 F St, Washington D.C., and subcontract #USAF-0040-SC-0024-1 under GDIT prime contract #FA8601-04-F-0040, awarded by the United States Air Force at Oklahoma City, Okla.

BACKGROUND OF THE INVENTION

1. Field of the Invention

The invention relates in general to hardface coatings, compositions and methods, and, more particularly, embodiments of the present invention relate to hardface coatings, compositions, and methods that relate to spall resistant, low density hardface coatings.

2. Description of the Prior Art

Hardface coatings, particularly chromium and tungsten based coatings formed by the thermal spraying of composite powders are well known, but they are generally prone to spalling, and they are heavy. Thermally sprayed tungsten carbide-cobalt coatings, for example, are very hard, brittle and dense. The formation of coatings by thermal spraying ceramics such as ceramic nitrides had been proposed, but ceramics generally decompose instead of melting. For example, ceramic nitrides decompose at about 1900 degrees centigrade. Thermal spraying operations are typically carried out at temperatures well in excess of 1900 degrees centigrade, so attempts to form coatings by thermal spraying ceramic nitrides had generally been unsuccessful. The application of ceramic nitrides via physical vapor deposition and chemical vapor deposition operations for forming coatings that control wear and friction had been previously proposed, but such vapor deposition operations tended to be slow and expensive.

Previous attempts to improve wear had typically involved making harder and stiffer coatings at the expense of ductility. In general, as the coatings became harder and stiffer, the occurrence of spalling increased.

Prior thermal spray operations for forming hardface coatings typically had as an objective the melting of at least the sprayed material, and often also the surface of the substrate. Thorough melting of the sprayed powder was generally believed to be beneficial and necessary because it improved the prospects for the formation of a metallurgical bond, as distinct from a mechanical bond, between the coating and the substrate. This thorough melting generally resulted in the composition of the coating being more or less uniform throughout. Typical prior thermal spray operations included, for example, HVOF (high velocity oxy-fuel), laser forming, plasma spray, plasma transferred arc, and the like.

Unfortunately, these thermally sprayed coatings, because of having high hardness, are brittle and are subject to spalling and catastrophic failure when subjected to impacts, point loading, or other high stress situations such as those that exist in landing gear cylinders used in carrier based aircraft. This spallation is caused by intensifying the stress in the high modulus coating, combined with its low strain tolerance. Furthermore, these coatings are very dense, ranging from about 8 grams per cubic centimeter for chrome carbide nickel chrome, and about 16 grams per cubic centimeter for tungsten carbide cobalt coatings. These higher density coatings add substantial weight, have low throughput through HVOF gun systems, and impose significant penalties in fuel economy and payload for aircraft and other transportation systems. Finally, these extremely hard coatings with limited ductility must be diamond super finished to prevent excessive seal wear, and eliminate surface flaws that cause early failure. Due to their brittleness and high modulus, they are extremely sensitive to flaws and defects on the surface, and in the coating. They are very difficult to apply, which limits their utility and the number of qualified applicators.

High stress and wear aerospace applications such as aircraft landing gear require a hardface coating on structural elements. Many such applications had previously involved the use of WC—Co coated high strength steels. It had been proposed to replace such high strength steels with titanium alloys, because of the weight savings that could be realized. The titanium alloys have a modulus of elasticity that is less than the previous high strength steels. The previous WC—Co coatings have been found to spall off of the titanium as it flexes. A hardface coating that has a modulus of elasticity low enough to not spall off of titanium is needed. For purposes of weight reduction structural members with thin cross-sections had been proposed. Such structural members tended to flex and deform. This resulted in spalling of the hardface coatings. Again, a ductile hardface coating was needed. The formation of a ductile hardface coating previously appeared to be unachievable. Hardness and ductility were generally believed to be unachievable in the same coating.

The use of thermal spray operations to form heterogeneous coatings in which isolated high ceramic content regions are embedded within a ductile matrix is disclosed in Sherman published U.S. application No. 2007/0141270, published Jun. 21, 2007, which is hereby incorporated herein by reference as though fully set forth hereat.

Those concerned with these problems recognize the need for an improved hardface coating.

BRIEF SUMMARY OF THE INVENTION

The present invention has been developed in response to the current state of the art, and in particular, in response to these and other problems and needs that have not been fully or completely solved by currently available expedients. Thus, it is an overall object of the present invention to effectively resolve at least the problems and shortcomings identified herein. Embodiments of the present invention are particularly suitable for use as hardfacings in aerospace structural elements where ruggedness, reliability, durability, and low density are significant factors for functionality and safety.

An embodiment of the present invention comprises a heterogeneous composite body that is spall resistant and comprises a substantially discontinuous cermet phase in a substantially continuous metal rich matrix phase.

Although capable of standing alone without a substrate, in certain embodiments, the heterogeneous composite bodies are bonded to a substrate such as, for example, steel, titanium, aluminum, or their alloys, particularly their high strength alloys. Such substrates are typically metals that require a hardfacing for purposes of wear, ruggedness, corrosion resistance, and durability.

The heterogeneous composite bodies exhibit ductile phase toughening with a strain to failure of at least about 2 percent, a modulus of elasticity of less than about 35 million pounds per square inch, and a density in some embodiments of less than about 7 grams per cubic centimeter, and in further embodiments, less than about 6 grams per cubic centimeter. The metal rich matrix phase between the ceramic rich regions in the heterogeneous composite bodies have an average span of about 0.5 to 10 microns to allow ductility in the heterogeneous composite bodies. The heterogeneous composite bodies have a Vicker's hardness number (VHN) of greater than approximately 500 in some embodiments, and greater than approximately 650 in further embodiments, up to approximately 1200 VHN.

The discontinuous cermet phases are in the form of ceramic rich regions embedded within the heterogeneous composite bodies, and includes ceramic particles and a cermet binder. The ceramic particles have a Moh's hardness of at least approximately 7.5, and in certain embodiments of from about 8 or 9, a modulus of elasticity of less than approximately 46, and in some embodiments of less than approximately 40 million pounds per square inch, and an average particle size of from about 0.1 to 10 microns. The ceramic rich regions exhibit high hardness as compared with the matrix phase.

According to certain embodiments, the heterogeneous composite bodies are prepared by agglomerating fine ceramic particles and thoroughly dispersed cermet binder into core cermet particles. The core cermet particles are then combined with metal rich matrix forming materials into heterogeneous composite bodies. The combining operation may be performed by a conventional thermal spraying operation, a conventional electrolytic deposition process, or the like. Where thermal spraying is employed to form the heterogeneous composite bodies, the core cermet particles are combined with the metal rich matrix forming materials into a feedstock for the thermal spraying operation. The thermal spraying operation may be conducted, for example, according to the teachings of Sherman published U.S. application No. 2007/0141270. HVOF thermal spraying processes have been found to be particularly suited to the production of certain embodiments of the present invention. When conventional electrolytic deposition procedures are employed, the core cermet particles may just be dispersed in the bath so they become entrapped in the coating as it forms.

To acquaint persons skilled in the pertinent arts most closely related to the present invention, an embodiment of a heterogeneous composite body that illustrates a best mode now contemplated for putting the invention into practice is described herein by, and with reference to, the annexed drawings that form a part of the specification. This exemplary embodiment is described in detail without attempting to show all of the various forms and modifications in which the invention might be embodied. As such, the embodiments shown and described herein are illustrative, and as will become apparent to those skilled in the arts, can be modified in numerous ways within the scope and spirit of the invention, the invention being measured by the appended claims and not by the details of the specification or drawings.

BRIEF DESCRIPTION OF THE DRAWINGS

The present invention provides its benefits across a broad spectrum of hardface applications, including aerospace, mining, oil, and gas exploration and development, equipment repair, farming and construction equipment, and the like. While the description which follows hereinafter is meant to be representative of a number of such applications, it is not exhaustive. As those skilled in the art will recognize, the basic compositions, heterogeneous composite bodies, and methods taught herein can be readily adapted to many uses. This specification and the claims appended hereto should be accorded a breadth in keeping with the scope and spirit of the invention being disclosed despite what might appear to be limiting language imposed by the requirements of referring to the specific examples disclosed.

Referring particularly to the drawings for the purposes of illustrating the invention and its presently understood best mode only and not limitation:

FIG. 1 depicts a flow chart of one embodiment for producing heterogeneous composite bodies according to the present invention.

DETAILED DESCRIPTION OF THE PREFERRED EMBODIMENTS

Figure 3:
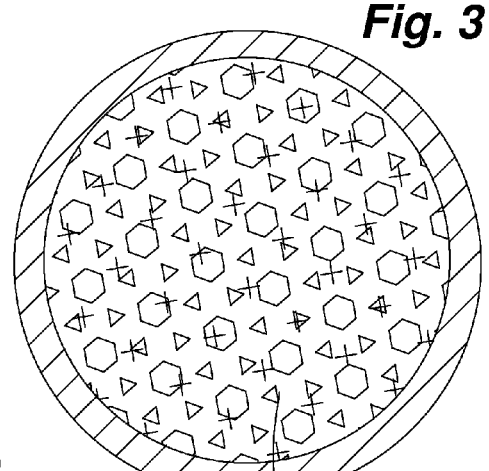
FIG. 3 diagrammatically depicts an embodiment of a coated cermet particle adapted for use as feedstock in a thermal spray operation, according to the present invention.

Referring now to the drawings wherein like reference numerals designate identical or corresponding parts throughout the several views. It is to be understood that the drawings are diagrammatic and schematic representations of various embodiments of the invention, and are not to be construed as limiting the invention in any way. The use of words and phrases herein with reference to specific embodiments is not intended to limit the meanings of such words and phrases to those specific embodiments. Words and phrases herein are intended to have their ordinary meanings in the art, unless a specific definition is set forth at length herein.

Figure 4:
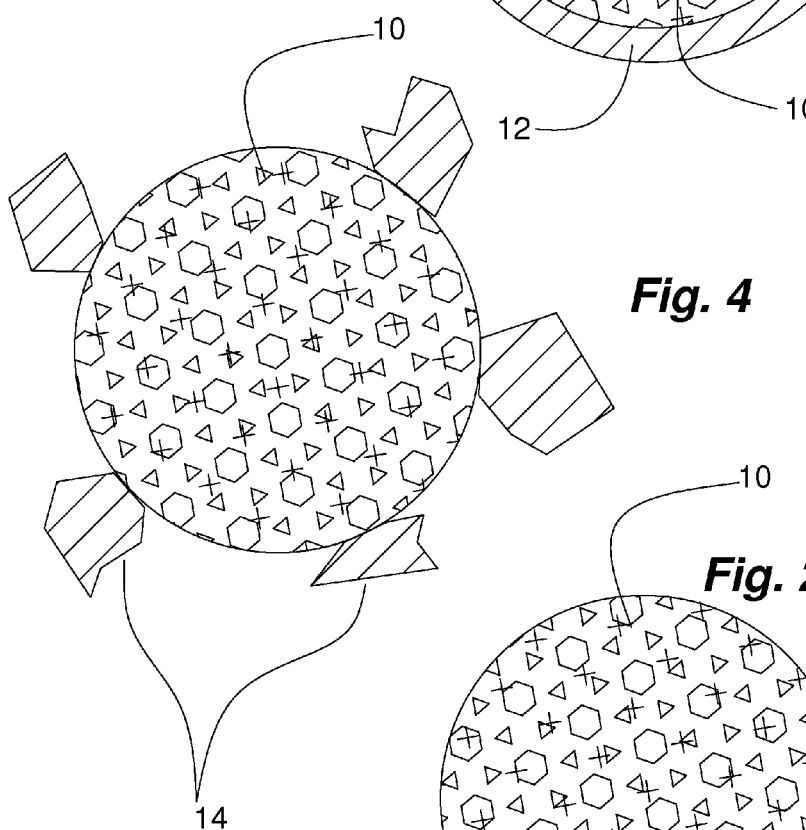
FIG. 4 diagrammatically depicts an additional embodiment of a core cermet particle and associated matrix forming metal rich particles adapted for use as feedstock in a thermal spray operation, according to the present invention.
Figure 2:
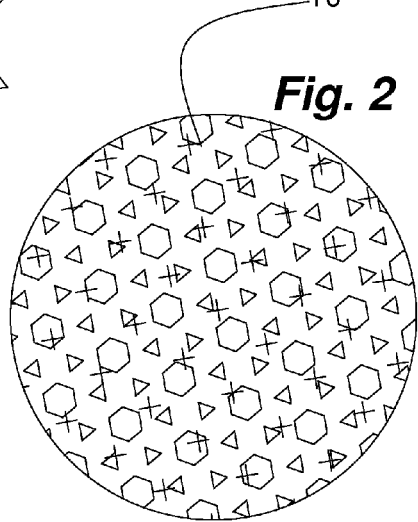
FIG. 2 diagrammatically depicts an embodiment of an agglomerated core cermet particle according to the present invention.

Referring particularly to the drawings, in the embodiments chosen for the purposes of illustration, there is illustrated generally at 10 a core cermet particle comprised of an agglomerated intimate mixture of ceramic particles and a cermet binder. The core cermet particle in the embodiment of FIG. 3 is encapsulated within a substantially continuous coating of a metal rich matrix forming material 12. In the embodiment of FIG. 4, particles of metal rich matrix forming material, of which 14 are typical, are associated with core cermet particle 10 by being adhered to the core cermet particle in a discontinuous coating.

Figure 5:
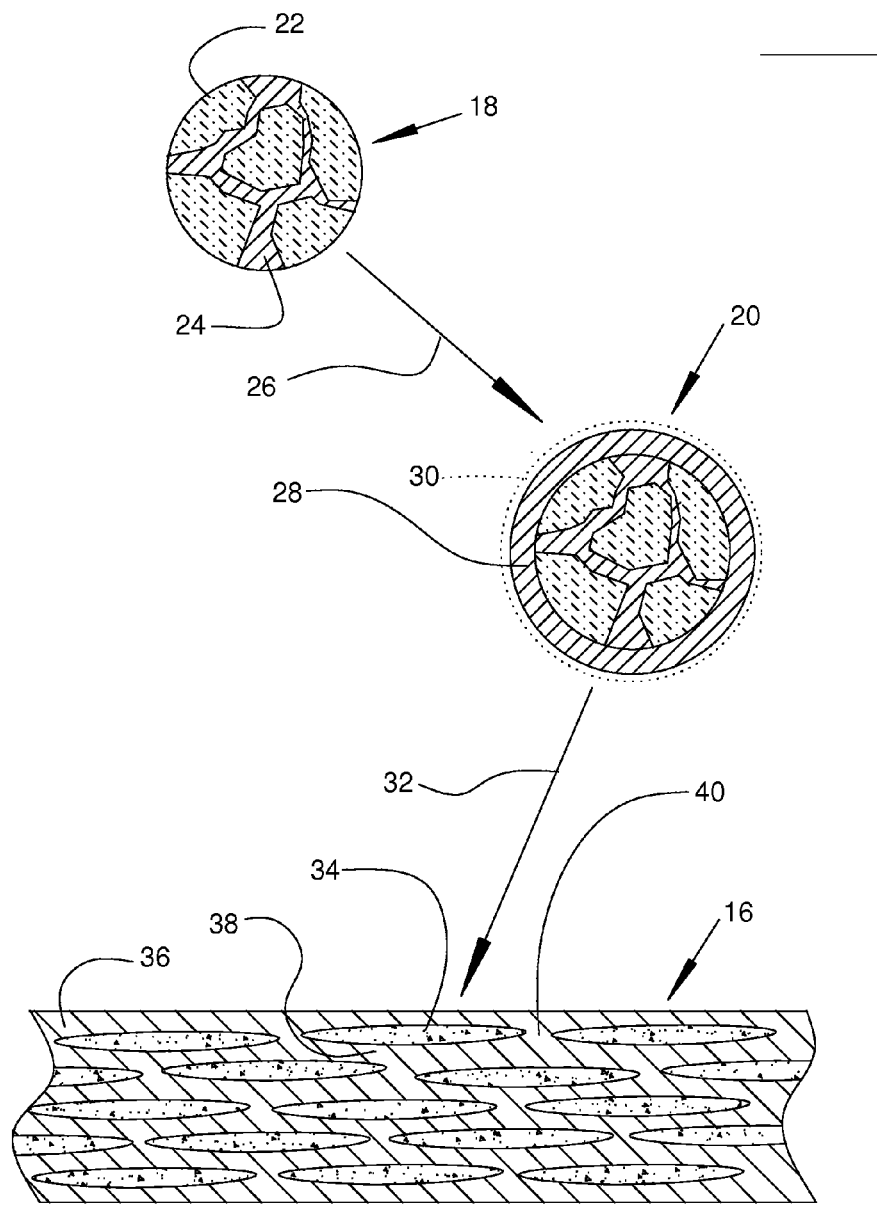
FIG. 5 diagrammatic depicts an embodiment of a process of forming a heterogeneous composite body according to the present invention.

In the embodiment of FIG. 5, a heterogeneous composite body 16 is formed by selecting an agglomerated and consolidated core cermet particle 18, coating it in coating step 26, to form a substantially continuously coated cermet particle 20 that is substantially encapsulated within metal rich matrix forming material 28. Coated cermet particle 20 is supplied as the feedstock for a thermal spraying step 32. The softened coated cermet particle 20 impinges on a substrate (not shown) to form the heterogeneous composite body 16. Substantially continuously coated cermet particle 20 deforms to form a discontinuous cermet phase in heterogeneous composite body 16. The discontinuous cermet phase, in the embodiment chosen for illustration, comprises ceramic rich regions of which 34 is typical. Such ceramic rich regions are generally in the form of lenticular shaped deposits embedded within and generally spaced from one another by a substantially continuous metal rich matrix phase 36. The ceramic rich regions 34 are generally formed from the deformed core cermet particles 18, while the metal rich matrix phase 36 is generally formed from the metal rich matrix forming material 28. Additives 30 may be included at any stage in the formation of the cermet particle. Such additives are indicated generally at 30. Such additives are generally conventional, and they are included for beneficially modifying the behavior or properties of the cermet particle. The ceramic rich regions are generally spaced apart by a span, as indicated generally at 38 and 40. The span is irregular in shape and size but exhibits an average distance that is largely dictated by the proportioning of the metal rich matrix forming material 28 to the coated cermet particle 20. The spans are substantially filled with the continuous metal rich matrix phase 36. Replacing the substantially continuous coated cermet particle 20 with a discontinuous coated cermet particle as illustrated in FIG. 4 provides substantially the same heterogeneous composite body 16. The use of particles of loose metal rich matrix forming material (not illustrated) results in substantially the same heterogeneous composite body 16, provided that the feedstock is very thoroughly mixed so as to form a loose discontinuous coating around the core cermet particle.

According to certain embodiments, the heterogeneous composite body has a strain to failure of from more than 1, and in certain embodiments, about 2 to 6 percent and a modulus of from approximately 35 to 15, or 30 to 20 million pounds per square inch. In some embodiments, the metal rich matrix phase has an average span between the cermet regions of the discontinuous cermet phase of about 0.5 to 10 microns, and in some additional embodiments, a minimum span of about 0.4 or 0.5, up to a maximum of about 8 microns, and in some further embodiments a span of from about 0.5 to 2 microns.

The span of the metal matrix phase between the cermet regions has been found to contribute substantially to the ductility of the heterogeneous composite body. The span of metal rich matrix is in the nature of a ductile phase inclusion that has a minimum average dimension. The span must be sufficient to permit the metal rich matrix phase to work harden. A minimum span of approximately 0.4 to 0.5 microns has been found to be required to achieve proper ductility. If this span is too small, there is little or no work hardening, and the heterogeneous composite body tends to break under stress. If the average span is greater than it needs to be to permit work hardening (generally less than about 8, and in some embodiments about 6 or 5 or 2 or less microns), the hardness, density, and abrasion resistance of the heterogeneous composite body may not be sufficient for the intended uses. The amounts of cermet and metal rich matrix phase are proportioned in the heterogeneous composite body to achieve an optimum average span for a particular heterogeneous composite body. For certain embodiments the optimum proportions are determined by an initial calculated approximation (using the Rule of Mixtures) followed by an iterative process of actual testing.

The metal rich matrix phase comprises a ductile metal. The metal rich matrix phase extends between the cermet regions that are formed from the cermet particles. The cermet regions are ceramic rich as compared to the metal rich matrix phase. Certain embodiments, for example, utilize as the ductile metal at least one of nickel and cobalt and their alloys; Ni—$Ni_3P$; NiP; $Ni_2P$; Ni—Cr; Fe—Cr—Al; Ni—$Ni_2B$, Co—$Co_3P$, Fe—Al alloys, Ni—Al alloys, titanium and its alloys, including Ni—Ti alloys, copper and its alloys, and mixtures and alloys of these. The metals rich matrix phase should have a modulus of less than approximately 42, and in some embodiments less than approximately 35 million pounds per square inch. The modulus exhibited by chrome is 42 million pounds per square inch. The metal in the metal rich matrix phase should melt below about 1900 degrees centigrade (the decomposition temperature of silicon nitride). The material in the metal rich matrix phase should not react significantly with the ceramic at the temperatures encountered in a thermal spraying operation.

The metal rich matrix forming material generally comprises from about 5 to 40 volume percent (V %) of the feedstock from which the heterogeneous composite body is formed, and according to some embodiments, from about 5 or 10 or 15 to 20 or 25 to 35V %. The cermet particles that are used as feedstock in a thermal spraying operation generally have average particle sizes in the range of from about 10 to 60, and in some embodiments from about 20 to 50 microns. The cermet particle size depends largely on the requirements of the particular spray gun that is used, and the thermal mass and density of the particular particles. In general, particle sizes below 10 microns tend to plug many spray guns, and particles above 60 microns tend to cause grit blasting of the substrate against which they are sprayed.

According to certain embodiments, the heterogeneous composite bodies have a density of less than about 6 grams per cubic centimeter. To achieve this, the amount of low density ceramic must be maximized while still achieving the desired strain to failure and modulus properties. Where the mode of application involves thermal spraying, and ceramic nitrides are involved, there is an additional consideration. There is a balance between the cermet binder and the ceramic nitride. Ceramic nitrides typically decompose instead of melting. For example, $Si_3N_4$ decomposes at about 1900 degrees centigrade. Thermal spraying systems typically operate at temperatures that are significantly above this decomposition temperature. Unprotected nitride ceramics decompose at the temperatures that are normally employed in thermal spraying operations. When the cermet binder is very thoroughly distributed in the cermet (for example, by coating the ceramic particles, or employing extended mixing times with cermet binder particles of approximately a micron in average diameter) less decomposition of the ceramic particles occurs. While not wishing to be bound by any theory, the thoroughly distributed cermet binder apparently tends to hold the gaseous decomposition products in intimate contact with the ceramic particles so the decomposition reaction is kinetically suppressed. There needs to be sufficient cermet binder and it must be thoroughly enough distributed to suppress the decomposition of the ceramic particles. According to some embodiments, less than approximately 20 percent of the ceramic nitrides decompose during thermal spraying. Without enough thoroughly distributed cermet binder in the cermet, the decomposition rate approaches 100 percent. For certain embodiments, the optimum proportions and mixing operations are determined for a particular ceramic-cermet binder combination by an initial calculated approximation (based on the Rule of Mixtures) followed by an iterative process of actual testing. According to certain embodiments, the ceramic particles comprises from about 30 to 80, or from about 40 to 70, or from about 40 to 50 volume percent of the agglomerated core cermet particles.

According to certain embodiments, the average particle sizes of the ceramic particles range from about 0.01 or lower to about 10 microns. In further embodiments the ceramic particle average sizes range from about 0.1 to 8 microns or 0.3 to 8 microns, and in additional embodiments from about 0.3 to 5 microns. With average ceramic particle sizes larger than from about 8 to 10 microns the resulting heterogeneous composite bodies tend to exhibit higher corrosion and wear rates than exhibited by heterogeneous composite bodies with ceramic particles below about 10 microns in size. The lower practical limit on ceramic particle size is imposed by processing limitations. Below about 0.1 microns it becomes difficult to produce consistent uniform cermets.

The ceramic particles, according to certain embodiments, are ceramics with a high hardness to stiffness ratio. That is, such ceramics have a high hardness and a low modulus. Suitable ceramics with the necessary hardness and low modulus of elasticity include, for example, the nitrides, carbonitrides, and oxynitrides of silicon, chromium, vanadium, aluminum, zirconium, niobium, and mixtures thereof, zircon, zirconia, sapphire, and mullite. Alumina by itself has a modulus of about 48 to 50 million pounds per square inch, but it can be satisfactorily blended with other ceramics that have a lower modulus or it may be used in small volume fractions. Zircon has a modulus of about 21 million pounds per square inch, and zirconia has a modulus of about 35 million pounds per square inch. Mullite has a Moh's hardness of about 9 and a modulus of about 38 million pounds per square inch. In certain embodiments the ceramic particles comprise at least one of $Si_3N_4$, VN, $V_2N$, CrN, $Cr_2N$, ZrN, $Nb_2N$, SiCN, SiON, or SiALON. Nitrides exhibit low friction and generally a high thermal compatability with metals.

The cermet binder in certain embodiments comprises metal particles having an average size of less than about 5 microns down to about 0.5 microns, and in further embodiments from about 2 to 0.5 microns. For the purposes of safety, the particle size of metallic cermet binders should be above that at which they become explosive when exposed to air. Suitable metals according to certain embodiments include, for example, Ni, Co, Fe, and their alloys with Cr, Al, and Ti, and mixtures thereof. In further embodiments the cermet binder is a metal coating on the ceramic particles. Such metal coatings are applied by conventional techniques, including, for example, chemical vapor deposition, vigorous mixing or milling under conditions where the metal is smeared onto the ceramic, or the like.

Spallation had become a significant problem for prior hardface coatings, particularly on high stress and thin section structural components. Spallation is a combination of modulus (the amount of stress built up for a given deflection), and ductility or strain tolerance. It is not just modulus, it is a combination of modulus and ductility or toughness, interlacing with adhesive strength. Ceramics generally have strain tolerance of less than 0.7 percent, combined with high modulus and generally poor adhesion. Previous hardfacing materials generally had high modulus, relatively poor strain tolerance ductility (WC—Co is about 0.5-0.8 percent). Heterogeneous composite bodies according to the present invention have low modulus, or little modulus mismatch with a substrate to which it is adhered (matched to steel in the ideal case where steel is used as a substrate), so there is little strain mismatch, good adhesion (above about 10,000 pounds per square inch), and very high toughness or strain tolerance (above 1 percent, and in most embodiments, above about 2 percent, and for some embodiments above about 3 percent). Strain tolerance means that defects work-harden and redirect strain away from a deformation zone, which is not generally a property enjoyed by prior hardface coatings. The following examples of the best mode presently contemplated for the practice of the present invention will illustrate the practice of the present invention and suggest additional embodiments to those skilled in the art.

Example 1

The first of two agglomerated microcomposite powders were prepared by ball milling about 0.5 micron $Si_3N_4$ powders with about 28 volume percent (V %) Ni and about 7V % Cr powder for about 24 hours in a ball mill. This Example is diagrammatically illustrated in FIG. 1. The second powder consisted of about 0.5 micron TiN powder with about 28 V % Ni and about 7 V % Cr, and it was prepared in the same way as the $Si_3N_4$—Ni—Cr powders. All of the following steps were identical for both powders. A polyvinyl alcohol binder was added along with water and conventional surfactants to reduce the viscosity of the resulting slurry to between 100 and 300 centipoises. An agglomerated powder was formed by spray drying the slurry. The slurry was spray dried at about 15,000 revolutions per minute using a centrifugal atomizer, a gas temperature of about 300 degrees Centigrade, and an exit temperature of about 180 degrees Centigrade to create approximately spherical, free flowing agglomerated powders. These powders were debound at 200 to 400 degrees centigrade in argon/hydrogen, and sintered for about 2 hours at about 1250 degrees centigrade to produce a densified, free flowing powder wherein the average particle had a diameter of approximately 38 microns. The powders were screened to produce a −230/+400 mesh cut. The screened powders were further coated with about 10 wt % nickel using the decomposition of nickel carbonyl in a fluidized bed reactor. The nickel coated agglomerated powders were then sprayed onto a grit-blasted M300 steel substrate using a Diamond Jet 2600hybrid thermal spray system (manufactured by the Sulzer Metco) utilizing hydrogen as the fuel, and oxygen as the oxidizer gas. The test specimens were as indicated below in Table 1. The resultant coatings had a Vicker's hardness number (VHN) of about 600, an adhesive strength of greater than about 10,000 pounds per square inch gauge (pursuant to ASTM 622 bonded pin adhesion test). The coatings had a density of about 5.6 grams per cubic centimeter for the $Si_3N_4$ powder, and 6.4 grams per cubic centimeter for the TiN powder. The coated coupon was bent around a ½ inch diameter mandrel into a "U" shape without delamination or separation of the coating from the substrate. Bend ductility was measured using an ASM bend ductility coupon. A $\frac{1}{32}^{nd}$ inch thick steel plate 6 inches long was thermally sprayed to form a 50 to 70 micron thick coating (2 TO 3 mils). This coupon was bent around a tapered mandrel with a diameter varying from 0.5 to 1 inch in diameter. The bend ductility was estimated from where cracks or striations are first observed. A 1 inch bend is approximately 3.5 percent ductility, and a 0.5 inch bend diameter is approximately 7 percent ductility. Table 1 shows the results of multiple tests completed with these two coatings when applied to the spallation test samples. This spallation testing utilized R=−1.0 on coated 4340M (M300) steel. This is a compression/tension spallation test designed to simulate aircraft landing gear stresses. This uncoated steel has a 245 KSI Yield strength. The $Si_3N_4$ coating failed between 180 and 230 KSI but the TiN coating repeatedly failed at about 140 KSI. By comparison, WC—Co coatings typically spall between about 160 and 200 KSI. The TiN, $Si_3N_4$, and WC—Co coatings are all metallurgically bonded to the substrate. The modulus of elasticity for the $Si_3N_4$ coating was measured at about 20 million pounds per square inch. The modulus of elasticity for the TiN coating was calculated using the Rule of Mixtures to be about 41 million pounds per square inch. The strain to failure of both coatings was estimated from the bend radius at cracking to be between 3 and 4 percent. The $Si_3N_4$ coating is suitable for replacing chrome and WC—Co hardfacings in repairing aircraft actuators and landing gear cylinders. Embodiments of heterogeneous composite bodies in the form of coatings with modulus of elasticity at or below about 35 million pounds per square inch, prepared according to this Example, will exhibit residual stresses generally between approximately 5,000 pounds per square inch gauge (psig) compressive and approximately 3,000 psig tensile residual stresses, and in further embodiments, between approximately neutral tensile residual stress and approximately 2,000 psig compressive residual stress. Repetition of this Example with heterogeneous composite bodies in the form of coatings with modulus of elasticity at or below about 35 million pounds per square inch, will produce coatings that, when having a thickness of about 5 to 7 mils on 4340 or 300M steel, will withstand at least approximately 20 cycles at about 200 KSI to about 230 KSI fully reversed (R=−1) loading. Embodiments of such coatings will provide similar results when applied to other known ultra-high strength steels.

TABLE 1

| Coating | Spec No. | Coating Thickness | Failure Stress (KSI) |
| --- | --- | --- | --- |
| $Si_3N_4$—35V%NiCr | N-17 | .010 | 230 |
| $Si_3N_4$—35V%NiCr | N-14 (#365) | .010 | 190 |
| $Si_3N_4$—35V%NiCr | N-11 (#367) | .010 | 180 |
| TiN—35V%NiCr | N-6 | .010 | 140 |
| TiN—35V%NiCr | N-7 | .010 | 140 |

The coating in specimen N-17 (230 KSI) was under residual tension, while the coatings in specimens N-14 and N-11 (190/180 KSI) were under neutral residual stress. The acceptable minimum failure stress is approximately 180 KSI for aircraft landing gear. Anything below that is at risk of failing. A hard landing can generate stress of 160 KSI or more, which may result in spallation and coating failure if the failure stress of the coating is below approximately 180 KSI.

Spallation resistance is a combination of modulus of elasticity, ductility, and adhesive strength. Denser coatings of these materials tend to have high adhesive strengths. TiN and $Si_3N_4$ coatings are not as dense as WC—Co coatings. Although the adhesive strengths of TiN and $Si_3N_4$ coatings are both above 10,000 psi, they are not as high as those of the very dense WC—Co coatings. Because WC—Co coatings have a higher modulus of elasticity and a lower ductility than $Si_3N_4$ they have about the same spallation resistance. The TiN coatings have about the same density, adhesive strength, and ductility, but a much higher modulus of elasticity than the $Si_3N_4$ coatings, so the TiN coatings fail at a much lower level of stress.

Previously, various additives and modifiers had been proposed for various purposes in forming and using different cermet products. Such additives include, for example, wetting agents, grain growth inhibitors, melting point adjustment agents, and the like. The inclusion of optional modifiers and additives to the cermet particles is indicated at 30 (FIG. 5). Modifiers and additives typically serve to promote adhesion, or limit grain growth, or limit diffusion or reaction, or otherwise modify melting temperatures, physical, mechanical, or chemical properties, or the like.

Particularly where thermal spraying is employed to form the heterogeneous composite body, all of the materials that go into the heterogeneous composite body are contained in the cermet powder. Thus, the composition and physical configuration of the heterogeneous composite body are at least primarily determined by the composition and configuration of the cermet particles, together with the conditions under which the body is formed.

The cermet binder may include reinforcing inclusions or dissolved materials that alter the physical or chemical properties of the cermet binder and/or the heterogeneous composite body. In general, the cermet binder is more than 50 volume percent ductile metal.

The metal rich metal matrix precursor from which the metal rich matrix phase in the heterogeneous composite body is formed generally contains more than half and in certain embodiments, more than approximately 75 volume percent ductile metal. The metal rich matrix precursor material may include reinforcing inclusions or dissolved materials that alter the physical or chemical properties of the metal rich matrix phase of the heterogeneous composite body.

The heterogeneous composite bodies according to the present invention are typically formed in situ on a surface of a substrate. That is, the heterogeneous composite body forms in place from a more or less fluid state as compared with being formed somewhere else, transferred to and applied to the surface of the substrate. Being formed in situ from an approximately fluid state causes the heterogeneous composite body to bond as tightly as possible to the substrate. Where the bonding is mechanical, the formed in situ heterogeneous composite body conforms in minute detail to the supporting surface in a way that is impossible to achieve with a separately formed body. The in situ forming permits the heterogeneous composite body to conform to arcuate or angular surfaces, or surfaces where anchoring configurations or roughness has been deliberately provided.

The heterogeneous composite body is conveniently formed on a flat, arcuate, or angular surface of a substrate. The substrate typically has physical characteristics that differ from those of the heterogeneous composite body. Typically, the substrate supports and lends strength to the heterogeneous composite body, and the body provides wear resistance and hardness to the substrate. Where the heterogeneous composite body is intended to be separated from the substrate, the substrate can be a low melting alloy or a material that can be removed by leaching without harming the heterogeneous composite body, or the like. Where metallurgical bonding is required, the surface of the substrate can be pre-coated with an adhesion promoter. Adhesion promoters include, for example, aluminum or other elements that form low melting alloys with the metal rich matrix. Where mechanical bonds are to be formed, the bonding surface of the substrate can be roughened or porous.

The metal rich matrix phase precursor that is associated with the cermet particle can be, for example, in the form of a metal coating, a more or less loosely adhered deposit of particles, particles in loose but intimately mixed association with the ceramic particles, or the like. In certain embodiments, the ductile metal content in the metal rich matrix phase precursor is higher than the metallic content in the cermet powder.

Metallic deposits can be formed on the ceramic particles and the cermet core particle by mechanical, chemical, electrochemical, vapor deposition, agglomeration, sintering, or other conventional deposit forming procedures, as may be desired. Various processing steps carried out for the purposes of improving the integrity or other properties of the cermet particle or the components thereof, such as cleaning, activating, pre-coating, or the like, can be employed, if desired. The metal rich matrix phase precursor can be formed on the cermet core particle in one or several sequential operations to deposit the same or different such precursor materials under the same or different conditions.

What have been described are preferred embodiments in which modifications and changes may be made without departing from the spirit and scope of the accompanying claims. Many modifications and variations of the present invention are possible in light of the above teachings. It is therefore to be understood that, within the scope of the appended claims, the invention may be practiced otherwise than as specifically described.

What is claimed is:

1. A heterogeneous composite body adhered to a substrate with an adhesive strength of greater than about 10,000 pounds per square inch gauge, said heterogeneous composite body being spall resistant and comprising a discontinuous cermet phase formed by cermet regions in a metal rich matrix phase, said metal rich matrix phase having an average span between said cermet regions sufficient to permit said metal rich matrix phase to work harden, said discontinuous cermet phase including ceramic particles and a cermet binder, said ceramic particles having a Moh's hardness of at least approximately 7.5, a modulus of less than approximately 46,000,000 pounds per square inch, and an average particle size of from about 0.1 to 10 microns, said heterogeneous composite body having a Vicker's hardness number of greater than approximately 500, a strain to failure of more than 1 percent, exhibits residual stresses of generally between approximately 5,000 pounds per square inch compressive and approximately 3,000 pounds per square inch tensile, and a modulus of less than approximately 35,000,000 pounds per square inch; wherein said ceramic particles comprise at least one of $Si_3N_4$, zircon, mullite, VN, $V_2N$, $Nb_2N$, SiCN, or SiON.

2. A heterogeneous composite body of claim 1 wherein said heterogeneous composite body exhibits said residual stresses of generally between approximately 2,000 pounds per square inch compressive and neutral tensile.

3. A heterogeneous composite body of claim 1 wherein said heterogeneous composite body has a strain to failure of from about 2 to 6 percent.

4. A heterogeneous composite body of claim 1 wherein said heterogeneous composite body has a modulus of from approximately 35,000,000 to 15,000,000 pounds per square inch.

5. A heterogeneous composite body of claim 1 wherein said cermet binder comprises a metal.

6. A heterogeneous composite body of claim 1 wherein said metal rich matrix phase comprises at least one of nickel, iron, copper, cobalt, silicon, alloys thereof with one another or with chromium, tungsten or molybdenum.

7. A heterogeneous composite body of claim 1 wherein said heterogeneous composite body has a density of less than about 6 grams per cubic centimeter.

8. A heterogeneous composite body of claim 1 wherein said heterogeneous composite body has a strain to failure of from more than 1 percent to 6 percent.

9. A heterogeneous composite body of claim 1 wherein said heterogeneous composite body has a modulus of from approximately 30,000,000 to 20,000,000 pounds per square inch.

10. A heterogeneous composite body of claim 1 wherein said metal rich matrix phase has an average span of about 0.4 to 8 microns.

11. A heterogeneous composite body of claim 1 wherein said metal rich matrix phase has an average span of less than about 2 microns.

12. A heterogeneous composite body of claim 1 wherein said discontinuous cermet phase generally comprises a plurality of approximately parallel extending lenticular shaped islands embedded in said metal rich matrix phase.

13. A heterogeneous composite body of claim 1 wherein said ceramic particles have an average particle size of from about 0.3 to 8 microns.

14. A heterogeneous composite body, said heterogeneous composite body being spall resistant and adhered to a substrate with an adhesive strength of greater than about 10,000 pounds per square inch gauge, said heterogeneous composite body comprising a discontinuous cermet phase in a metal rich matrix phase, said discontinuous cermet phase including ceramic particles and a cermet binder, said ceramic particles having a Moh's hardness of at least approximately 8, a modulus of less than approximately 46,000,000 pounds per square inch, and an average particle size of from about 0.1 to 10 microns, said heterogeneous composite body having a Vicker's hardness number of greater than approximately 650, a strain to failure of at least about 2 percent, said heterogeneous composite body exhibiting strain tolerance wherein defects work harden and redirect strain away from a deformation zone, a density of less than about 7 grams per cubic centimeter, and a modulus of less than approximately 35,000,000 pounds per square inch, and said metal rich matrix phase having an average span sufficient to permit said metal rich matrix phase to work harden; wherein said ceramic particles comprise at least one of $Si_3N_4$, zircon, mullite, VN, $V_2N$, $Nb_2N$, SiCN, or SiON.

15. A heterogeneous composite body, said heterogeneous composite body being spall resistant and adhered to a substrate with an adhesive strength of greater than about 10,000 pounds per square inch gauge, said heterogeneous composite body comprising a discontinuous cermet phase in a metal rich matrix phase, said metal rich matrix phase having a modulus of less than approximately 42,000,000 pounds per square inch, said discontinuous cermet phase including ceramic particles and a cermet binder, said ceramic particles having a Moh's hardness of at least approximately 8, a modulus of less than approximately 46,000,000 pounds per square inch, and an average particle size of from about 0.3 to 8 microns, said heterogeneous composite body having a Vicker's hardness number of greater than approximately 750, a strain to failure of from at least about 2 to about 6 percent, said heterogeneous composite body exhibiting strain tolerance wherein defects work harden and redirect strain away from a deformation zone, a density of less than about 6 grams per cubic centimeter, residual stresses of generally between approximately 5,000 pounds per square inch compressive and approximately 3,000 pounds per square inch tensile, and a modulus of less than approximately 35,000,000 pounds per square inch, and said metal rich matrix phase has an average span of about 0.5 to 2 microns; wherein said ceramic particles comprise at least one of $Si_3N_4$, zircon, mullite, VN, $V_2N$, $Nb_2N$, SiCN, or SiON.

16. A heterogeneous composite body adhered to a substrate with an adhesive strength of greater than about 10,000 pounds per square inch gauge, said heterogeneous composite body being spall resistant and comprising a discontinuous cermet phase in a metal rich matrix phase, said discontinuous cermet phase including ceramic particles and a cermet binder, said metal rich matrix phase having an average span of about 0.4 to 8 microns and a modulus of less than approximately 42,000,000 pounds per square inch, said heterogeneous composite body having a Vicker's hardness number of greater than approximately 650, a strain to failure of at least about 2 percent, said heterogeneous composite body exhibiting strain tolerance wherein defects work harden and redirect strain away from a deformation zone, and a modulus of less than approximately 35,000,000 pounds per square inch, there being little strain mismatch between said substrate and said heterogeneous composite body; wherein said ceramic particles comprise at least one of $Si_3N_4$, zircon, mullite, VN, $V_2N$, $Nb_2N$, SiCN, or SiON.

17. A heterogeneous composite body of claim 16 wherein said heterogeneous composite body exhibits residual stresses of generally between approximately 5,000 pounds per square inch compressive and approximately 3,000 pounds per square inch tensile.

18. A heterogeneous composite body of claim 16 wherein said ceramic particles have a modulus of less than approximately 40 million pounds per square inch.

\* \* \* \* \*